(12) United States Patent
Takeuchi et al.

(10) Patent No.: US 7,791,206 B2
(45) Date of Patent: Sep. 7, 2010

(54) SEMICONDUCTOR DEVICE AND METHOD OF MANUFACTURING THE SAME

(75) Inventors: Yukiharu Takeuchi, Nagano (JP); Hidenori Takayanagi, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/051,566

(22) Filed: Jan. 27, 2005

(65) Prior Publication Data
US 2005/0184377 A1    Aug. 25, 2005

(30) Foreign Application Priority Data
Jan. 30, 2004    (JP)    ............................. 2004-022581

(51) Int. Cl.
*H01L 23/06*    (2006.01)
(52) U.S. Cl. ................................. 257/774; 257/E23.06
(58) Field of Classification Search ................. 257/737, 257/774, 778, 787, E23.06, E23.129, E23.145, 257/E23.169
See application file for complete search history.

(56) References Cited
U.S. PATENT DOCUMENTS

| 6,590,291 B2 | 7/2003 | Akagawa | 257/774 |
| 6,614,104 B2 * | 9/2003 | Farnworth et al. | 257/686 |
| 6,625,880 B2 * | 9/2003 | Nabemoto et al. | 29/830 |
| 6,988,312 B2 | 1/2006 | Nakamura et al. | 29/830 |
| 7,018,866 B2 * | 3/2006 | Sugaya et al. | 438/108 |
| 7,034,386 B2 | 4/2006 | Kurita | 257/685 |
| 7,105,919 B2 * | 9/2006 | Kim | 257/700 |
| 2002/0180004 A1 * | 12/2002 | Oggioni et al. | 257/621 |

FOREIGN PATENT DOCUMENTS

| JP | 2001-217337 | 8/2001 |
| JP | 2002-359323 | 12/2002 |
| WO | 03/039219 | 5/2003 |

\* cited by examiner

*Primary Examiner*—Lynne A Gurley
*Assistant Examiner*—Colleen A Matthews
(74) *Attorney, Agent, or Firm*—Kratz, Quintos & Hanson, LLP

(57) ABSTRACT

In a semiconductor device, via holes are formed around a chip buried in a package, and conductor layers are respectively formed to be connected to one end and another end of the conductor filled in the individual via hole. Portions (pad portions) of the conductor layers which correspond to the conductors are exposed from protective films, or external connection terminals are bonded to the pad portions. The chip is mounted with flip-chip technology so that at least some of electrode terminals thereof are electrically connected to the conductor layers.

2 Claims, 13 Drawing Sheets

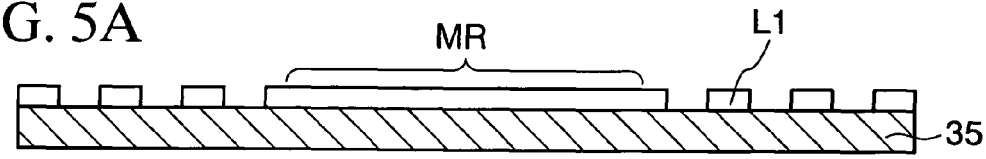
FIG. 5A
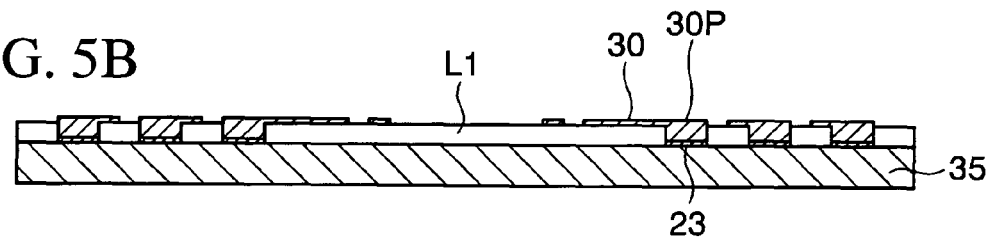
FIG. 5B
FIG. 5C
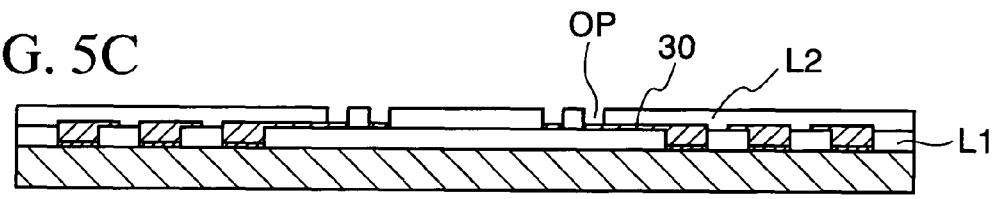
FIG. 5D
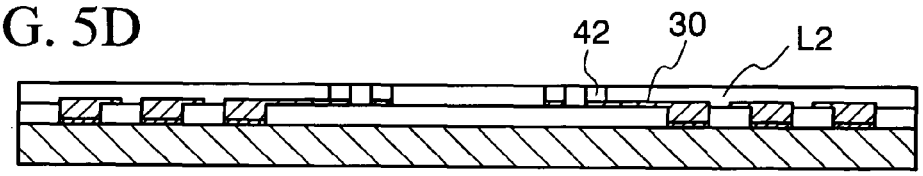
FIG. 5E
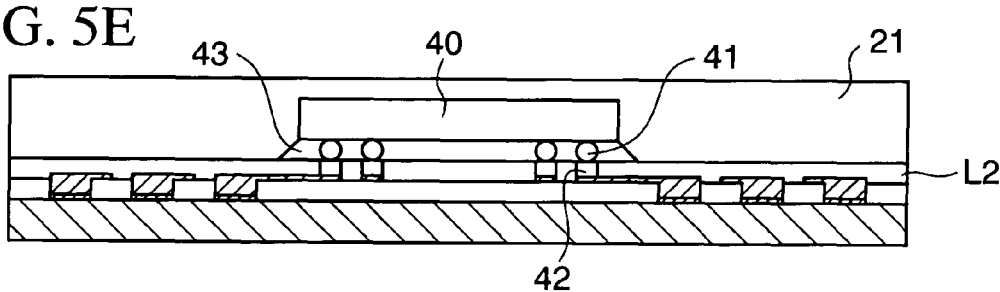
FIG. 5F
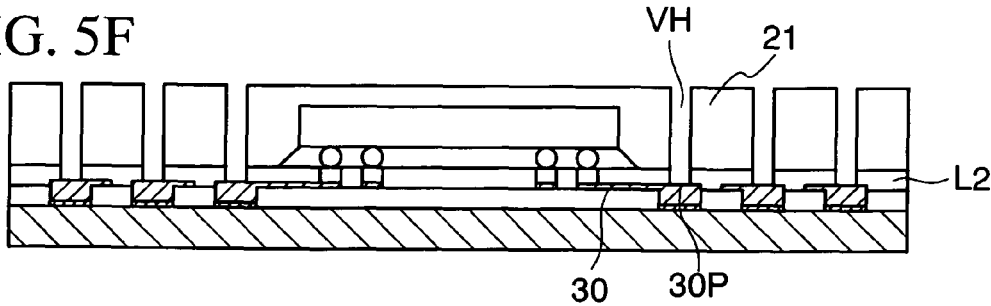

SEMICONDUCTOR DEVICE AND METHOD OF MANUFACTURING THE SAME

CROSS-REFERENCE TO RELATED APPLICATIONS

This application is based on and claims priority of Japanese Patent Application No. 2004-022581 filed on Jan. 30, 2004, the entire contents of which are incorporated herein by reference.

BACKGROUND OF THE INVENTION (a) Field of the Invention

The present invention relates to a semiconductor device and a method of manufacturing the same. More specifically, the present invention relates to a semiconductor device having a package structure in which a semiconductor element (chip) is mounted inside a wiring board for a reduction in thickness, and relates to a method of manufacturing the same.

(b) Description of the Related Art

Heretofore, semiconductor devices having various forms have been proposed in which a chip is mounted inside a wiring board. As an example thereof, there is a package structure (semiconductor device) intended to form a required circuit block by incorporating and stacking a plurality of chips, for example, typified by System Block Module manufactured by Toshiba Corporation Semiconductor Company. In this semiconductor device, connection between upper and lower layers is established around chips. Accordingly, on the upper and lower surfaces of each package, top-and-bottom connecting pads are placed around the chip. The top-and-bottom connecting pads are used for connecting packages (chips) stacked on and under the relevant package (chip). Most of the top-and-bottom connecting pads are connected also within the relevant package. In such a semiconductor device, plated through holes have been typically used as means for connecting the top-and-bottom connecting pads within the package.

For example, as described in Japanese unexamined Patent Publication (JPP) 2001-217337, technologies relating to the above-described known technology include the following technology: multilayer stacking can be realized by burying and mounting a semiconductor chip in a package, and providing external connection terminals on both surfaces of the package or exposing, from a solder resist layer, terminal formation portions (pad portions) of a wiring pattern to which external connection terminals are to be connected.

As described above, in a known package structure (semiconductor device) adapted for the stacking of a plurality of chips using top-and-bottom connecting pads provided in a region around the chips, plated through holes have been utilized when the top-and-bottom connecting pads are connected within the package.

However, plated through holes are often formed by drilling. Consequently, the diameters of the through holes become relatively large (approximately 250 to 300 μm in the state of the art), and there has been the disadvantage in that a larger area is accordingly required. Further, there are constraints on design (i.e., the degree of freedom of wiring is low), such as a technical difficulty of placing top-and-bottom connecting pads on plated through holes. Accordingly, the relevant pads must be formed at other positions, and an area required around a chip increases. This has become an obstacle to miniaturization.

Essentially, one of major purposes in stacking chips is to enhance functionality by incorporating a larger number of functional elements (chips) into a smaller volume. However, the above-described problem becomes a serious obstacle to the accomplishment of this purpose. Namely, in a package (semiconductor device) containing a chip, a region around the chip is not a portion which exerts an essential function as the semiconductor device, but a portion used for simply connecting upper and lower stacked packages. Accordingly, in consideration of recent demands for smaller sizes, higher densities, and the like, of thin-type packages, it is more desirable that an area required around a chip is as small as possible.

On the other hand, a conceivable method of coping with the above-described problems is as follows: after a chip is buried in resin, openings are formed at predetermined positions in a resin layer on the chip by laser processing, photolithography, or the like, to form via holes, and interconnections connected to pads of the chip through the via holes are formed. However, this method has a problem of the accuracy of opening positions when the via holes are formed on the chip. This becomes more pronounced as the sizes of via holes to be formed on the chip for electrical connection decreases and as the pitch decreases.

SUMMARY OF THE INVENTION

An object of the present invention is to provide a semiconductor device and a method of manufacturing the semiconductor device, in which when a semiconductor element (chip) is mounted in a package, miniaturization is realized and the degree of freedom of wiring is increased; in which necessity to form via holes for ensuring electrical connection to the chip is eliminated; in which a three-dimensional arrangement configuration of chips and connections therebetween can be easily realized as needed; and consequently which contributes to an enhancement of functionality.

To attain the above object, according to one aspect of the present invention, there is provided a semiconductor device including: a wiring board; and at least one semiconductor element buried in the wiring board, wherein the wiring board has an insulating base material; a via hole formed in a region around the semiconductor element to pierce the insulating base material in a thickness direction is filled with a conductor; first and second conductor layers which are respectively connected to one end and another end of the conductor and which have required pattern shapes are formed; and protective films for respectively covering the insulating base material and the conductor layers are formed with first and second pad portions exposed, the first and second pad portions being respectively delimited in portions of the first and second conductor layers which correspond to the conductor, and wherein the semiconductor element is placed with flip-chip technology with at least some of electrode terminals electrically connected to the first conductor layer.

In the semiconductor device according to this aspect, the semiconductor element (chip) is buried and mounted in the wiring board used as a package, and the via hole piercing the wiring board vertically (in the thickness direction) is formed in a region around the chip. This via hole can be formed to have a small diameter, for example, by laser processing, compared with a through hole formed by drilling as heretofore. This means that an area required around the chip can be relatively reduced, and contributes to a miniaturization of the package (semiconductor device).

Also, since the via hole is filled with the conductor, the first and second pad portions (top-and-bottom connecting pads) can be placed thereon. Namely, compared with the case where a through hole is formed as heretofore and where top-and-bottom connecting pads cannot be placed thereon and must be formed at other positions, the degree of freedom of wiring can be increased. Further, since the relevant pads do not need to be formed at other positions, an area required around the chip can be accordingly reduced. This contributes to a further miniaturization of the package (semiconductor device).

Moreover, since the semiconductor element (chip) is mounted with flip-chip technology to be electrically connected to the first conductor layer, the necessity to form via holes for ensuring electrical connection to the relevant chip (i.e., to form openings at predetermined positions in the insulating base material on the chip) is eliminated. Namely, hole-making process for the insulating base material by laser processing or the like is carried out only for a formation of the top-and-bottom connecting via hole in the region around the chip. Since the diameter of this via hole is sufficiently large compared with that of pads on the chip, the accuracy of an opening position can be relatively low when the via hole is formed.

Furthermore, devices according to this aspect can be stacked in a multilayered manner by using as top-and-bottom connecting pads the first and second pad portions respectively exposed from both surfaces of the package (semiconductor device), and further, interposing external connection terminals as needed. Accordingly, it is possible to easily realize a three-dimensional arrangement configuration of chips and connections therebetween. This contributes to an enhancement of functionality.

Also, according to another aspect of the present invention, there is provided a method of manufacturing a semiconductor device, including the steps of: forming a first conductor layer having a required pattern shape on one surface of a conductive base material, the first conductor layer extending within a semiconductor element mount region and having a first pad portion in a portion corresponding to a specific position around the semiconductor element mount region; mounting a semiconductor element with flip-chip technology to be electrically connected to the first conductor layer; forming an insulating base material to bury the semiconductor element; forming a via hole piercing the insulating base material to reach the first pad portion; filling a conductor into the via hole; forming a second conductor layer having a required pattern shape on the insulating base material, the second conductor layer being connected to the conductor filled in the via hole and having a second pad portion in a portion corresponding to the conductor; removing the conductive base material; and forming protective films respectively covering the insulating base material and the conductor layers with the first and second pad portions exposed.

Also, according to still another aspect of the present invention, there is provided a method of manufacturing a semiconductor device, including the steps of: forming a first protective film on one surface of a conductive base material with a portion corresponding to a specific position around a semiconductor element mount region exposed; forming a first conductor layer having a required pattern shape on the first protective film and the conductive base material, the first conductor layer extending within the semiconductor element mount region and having a first pad portion in a portion corresponding to the specific position; mounting a semiconductor element with flip-chip technology to be electrically connected to the first conductor layer; forming an insulating base material to bury the semiconductor element; forming a via hole piercing the insulating base material to reach the first pad portion; filling a conductor into the via hole; forming a second conductor layer having a required pattern shape on the insulating base material, the second conductor layer being connected to the conductor filled in the via hole and having a second pad portion in a portion corresponding to the conductor; forming a second protective film covering the insulating base material and the second conductor layer with the second pad portion exposed; and removing the conductive base material.

BRIEF DESCRIPTION OF THE DRAWINGS

FIGS. 5A to 5F are cross-sectional views showing manufacturing steps for the semiconductor device of FIG. 4;

DESCRIPTION OF THE PREFERRED EMBODIMENTS

Figure 1:
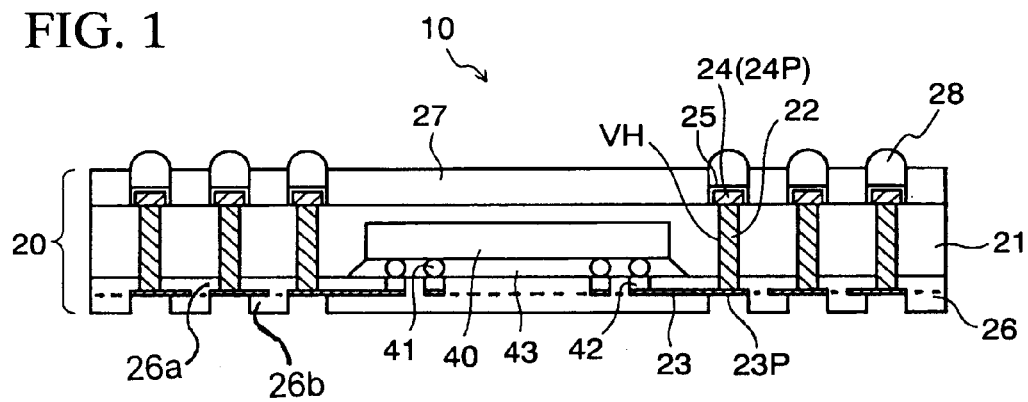
FIG. 1 is a cross-sectional view showing the structure of a semiconductor device according to a first embodiment of the present invention.
Figure 13:
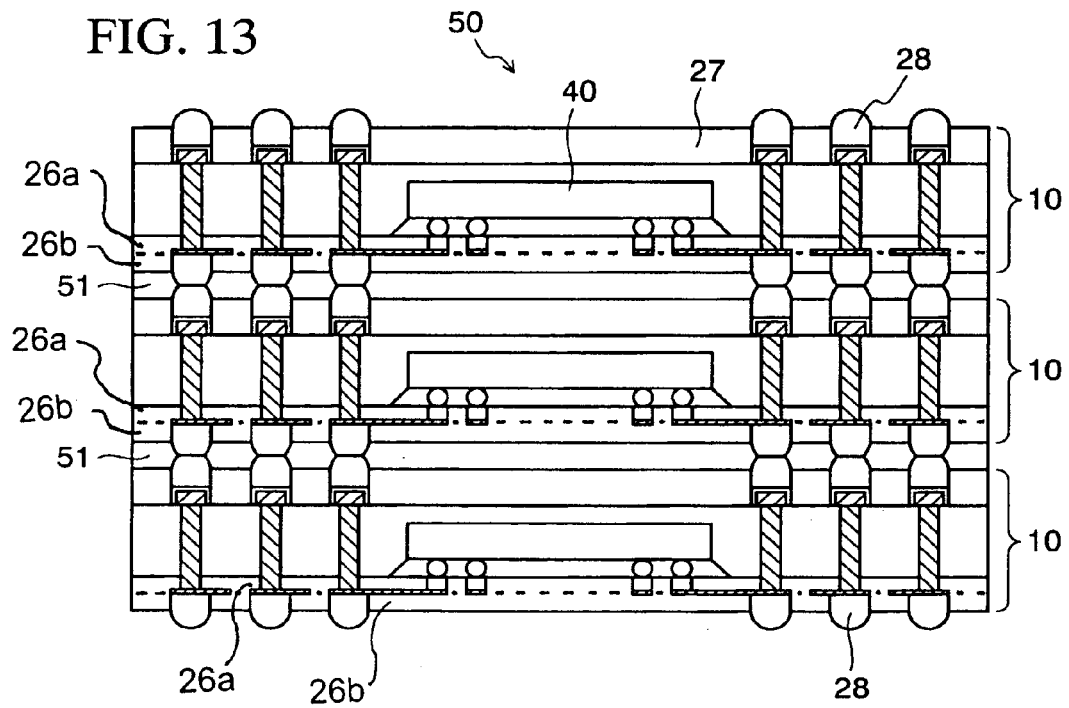
FIG. 13 is a cross-sectional view showing the structure of a semiconductor device according to a fifth embodiment of the present invention.
Figure 2A:
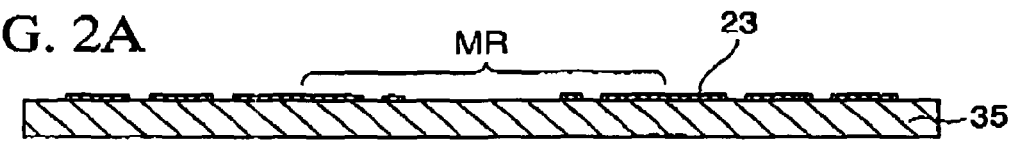
FIGS. 2A to 2F are cross-sectional views showing manufacturing steps for the semiconductor device of FIG. 1.
Figure 2B:
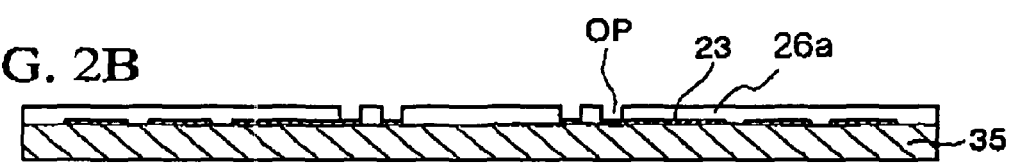
Figure 2C:
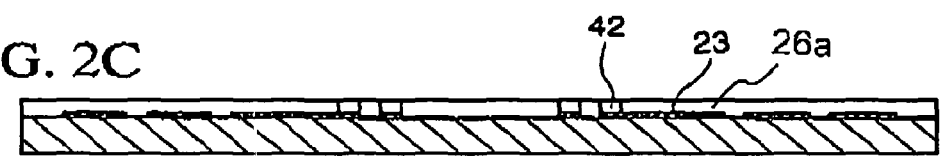
Figure 2D:
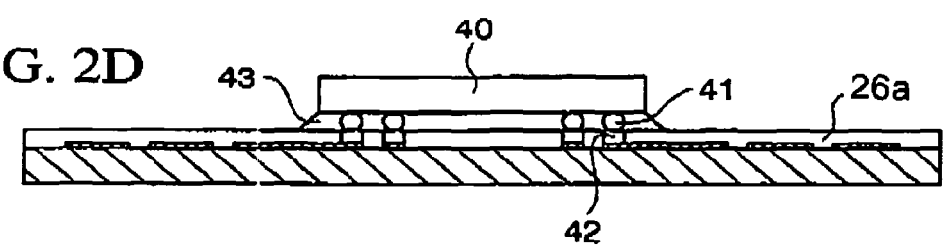
Figure 2E:
Figure 2F:
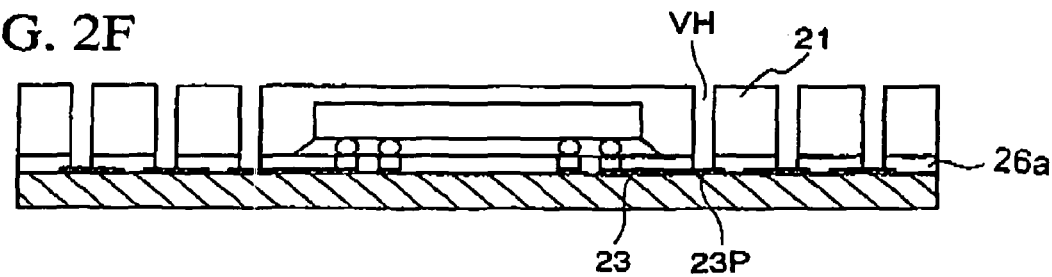
Figure 3A:
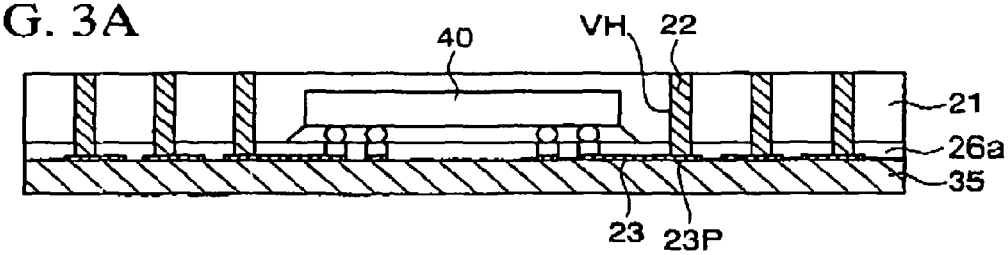
FIGS. 3A to 3E are cross-sectional views showing manufacturing steps subsequent to the manufacturing steps of FIGS. 2A to 2F.
Figure 3B:
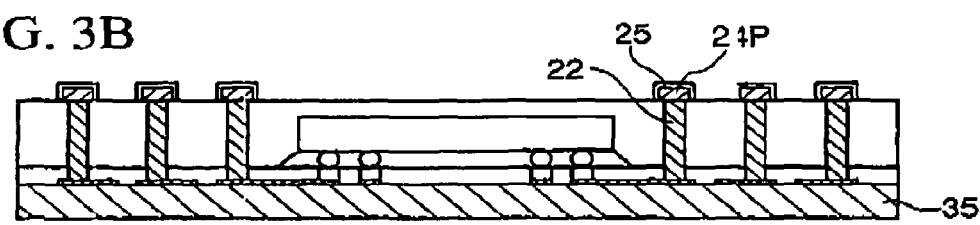
Figure 3C:
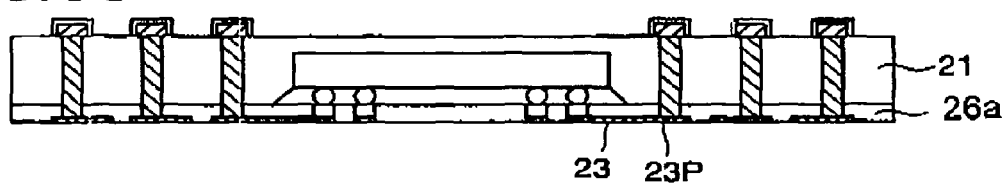
Figure 3D:
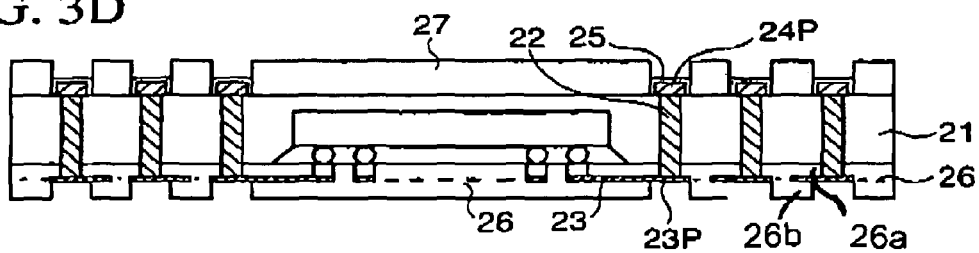
Figure 3E:
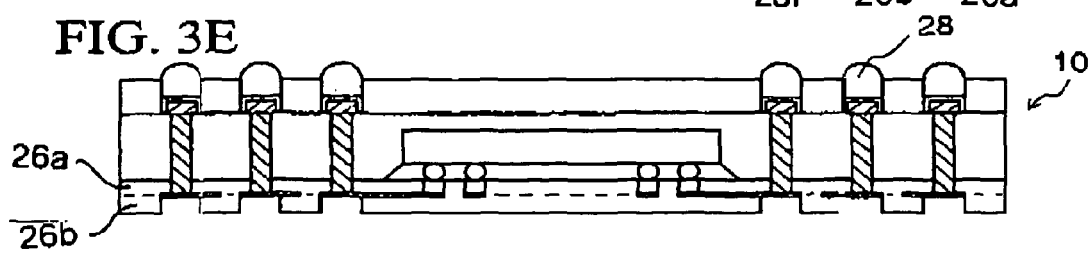

FIG. 1 schematically shows a cross-sectional structure of a semiconductor device according to a first embodiment of the present invention.

The semiconductor device 10 according to this embodiment includes a wiring board 20 used as a package, and a semiconductor element (silicon (Si) chip) 40 buried in this package (wiring board) 20. In the illustrated example, one semiconductor chip 40 is buried in one package. However, two or more semiconductor chips 40 may be appropriately buried therein depending on functions required for the present device 10.

In the package (wiring board) 20, reference numeral 21 denotes an insulating base material (e.g., a resin layer made of epoxy resin or the like) which serves as a base for the wiring board. In this resin layer 21, via holes VH piercing the resin layer 21 in the thickness direction are formed in a region around the semiconductor chip 40. These via holes VH are filled with conductors 22 (e.g., metal such as copper (Cu)). One end (lower surface in the illustrated example) of the conductor 22 is connected to a conductor layer 23 which is formed into a required pattern shape and which is made of conductive material (e.g., palladium (Pd), nickel (Ni), or gold (Au)). The portion of this conductor layer 23 which corresponds to the conductor 22 is delimited as a pad portion 23P and exposed at one surface (lower surface) of the wiring board 20. On the other hand, the other end (upper surface) of the conductor 22 is connected to a conductor layer 24 which is formed into a required pattern shape on the resin layer 21 and which is made of conductive material (e.g., Cu, Ni, or Au). The portion of this conductor layer 24 which corresponds to the conductor 22 is delimited as a pad portion 24P. Together with the lower pad portion 23P, the pad portion 24P is also formed to have a diameter (approximately 150 μm) slightly larger than that (approximately 100 μm) of the via hole VH. On the pad portion 24P, a conductor layer 25 (Ni/Au layer) is formed by Ni/Au plating as needed. Furthermore, protective films 26 and 27 (e.g., solder resist layers) are formed on both surfaces of the resin layer 21 in such a manner that the entire surfaces are covered with the pad portions 23P and the pad portions 24P (Ni/Au layer 25) exposed, respectively. The lower protective film 26 is made of a solder resist layer having a two-layer structure as described later. In the drawings, the two-layer structure is indicated as 26a and 26b of the lower protective film 26. Further, an external connection terminal 28 (e.g., solder bump) is bonded to the upper pad portion 24P (Ni/Au layer 25).

The external connection terminal 28 is provided in the illustrated example, but does not necessarily need to be provided. It is essential only that the pad portion 24P (Ni/Au layer 25) is exposed from the solder resist layer 27 so that an external connection terminal can be bonded thereto when necessary. Further, the external connection terminal 28 is provided only on one surface (upper surface) of the package (wiring board) 20 in the illustrated example, but may be provided on both surfaces of the package (wiring board) 20 as needed. In this case, the external connection terminal 28 is also bonded to the lower pad portion 23P. Alternatively, instead of providing the external connection terminal 28 on the upper pad portion 24P (Ni/Au layer 25), the external connection terminal 28 may be provided only on the lower pad portion 23P.

On the other hand, the semiconductor chip 40 is mounted within the package (wiring board) 20 with flip-chip technology as shown in the drawing. Namely, the semiconductor chip 40 is connected by flip-chip bonding, via electrode terminals 41 (e.g., solder bumps or Au stud bumps) bonded onto pads thereof, to a conductor 42 (e.g., metal such as solder) which is filled in a specific position in the lower solder resist layer 26, and further bonded to the solder resist layer 26 via underfill resin 43 which is filled in the space between the semiconductor chip 40 and the solder resist layer 26. Here, the "specific position" in the solder resist layer 26, means a position corresponding to the pad, which is located on the relevant chip, in a portion of the conductor layer 23 including the pad portion 23P which extends within a chip mount region. Accordingly, at least some of the electrode terminals 41 of the semiconductor chip 40 are electrically communicated with the conductor layer 23 (pad portions 23P) via the conductors 42. Further, it is desirable that a semiconductor chip having a thickness as small as possible is used as the semiconductor chip 40 because the semiconductor chip 40 is mounted within the package (wiring board) 20. In the state of the art, semiconductor chips having a thickness of approximately 50 to 100 μm have been provided. It is sufficiently technically possible to bury a semiconductor chip having a thickness in this range in the board. Accordingly, in this embodiment, a thin semiconductor chip having a thickness of approximately 50 μm is used as the semiconductor chip 40.

The semiconductor device 10 according to this embodiment has the following features: the necessity to form via holes (i.e., via holes piercing the resin layer 21 on the chip 40) for ensuring electrical connection to the chip 40 is eliminated by mounting the thin semiconductor chip 40 within the package (wiring board) 20 with flip-chip technology; the insides of the via holes VH formed around the chip 40 are filled with the conductors 22 so that top-and-bottom connecting pads (pad portions 23P and 24P) can be placed thereon; and furthermore that multilayer stacking can be realized using the top-and-bottom connecting pads as needed, as described later.

Hereinafter, a method of manufacturing the semiconductor device 10 according to the first embodiment will be described with reference to FIGS. 2A to 3E which show manufacturing steps thereof in order.

To begin with, in the first step (FIG. 2A), copper foil 35 is prepared as a conductive base material, and the conductor layer 23 having a required pattern shape is formed on one surface (upper surface in the example) of the copper foil 35. Namely, as shown in the drawing, patterning is performed so that the conductor layer 23 extends within the chip mount region MR and that portions corresponding to specific positions (positions where via holes described later are to be formed) around the chip mount region MR are delimited as the pad portions 23P (having a diameter of approximately 150 μm). For example, a pattern having a required shape is formed of plating resist on the copper foil 35 (Cu), then the surface of the copper foil 35 is plated with nickel (Ni) as an underlying layer using the copper foil 35 as a power supplying layer, after that, it is plated with palladium (Pd) and further plated with gold (Au) as needed, then the plating resist is removed, thus the conductor layer 23 is formed.

It is noted that, when the conductor layer 23 is formed, various passive elements (resistance element, inductance element, capacitance element) may be formed by a thin film process.

In the next step (FIG. 2B), a solder resist layer 26 is formed to cover the conductor layer 23 and the copper foil 35 with a specific portion of the conductor layer 23 exposed. Here, the "specific portion" is equivalent to the aforementioned "specific position", i.e., the position corresponding to the pad on a chip to be mounted, in the portion of the conductor layer 23 including the pad portion 23P which extends within the chip mount region MR. For example, photosensitive solder resist is applied to the entire surface of the conductor layer 23 and the copper foil 35, then exposure and development (patterning of solder resist) are performed in accordance with the shape of the above-described "specific portion" to form an opening (opening portion OP) in the portion of the solder resist layer which corresponds to the region of the specific portion. Thus, the specific portion of the conductor layer 23 is exposed, and the other portion of the conductor layer 23 is covered with the solder resist layer 26a. This solder resist layer 26a constitutes part (one layer of a solder resist layer) of the protective film 26 shown in FIG. 1.

In the next step (FIG. 2C), the opening portion OP of the solder resist layer 26 is filled with the conductor 42. For example, solder paste is filled into the opening portion OP, or electrolytic solder plating is performed using the copper foil 35 as a power supplying layer, thus filling the opening portion OP.

In the next step (FIG. 2D), the flip-chip bonding of the thin semiconductor chip 40 having a thickness of approximately 50 μm is performed using solder bumps, Au stud bumps, or the like (electrode terminals 41) in accordance with the positions of the conductors 42 in the chip mount region. Furthermore, the underfill resin 43 is filled into the space between the chip 40 and the solder resist layer 26 and cured, thus bonding the chip 40 to the solder resist layer 26. Alternatively, instead of the underfill resin 43, non-conductive paste (NCP) may be applied or non-conductive film (NCF) may be attached in advance so that the non-conductive paste or film is formed into a shape equivalent to that of the underfill resin 43 simultaneously with flip-chip bonding.

In the next step (FIG. 2E), the resin layer 21 is formed on the solder resist layer 26 in such a manner that the semiconductor chip 40 is buried. For example, the resin layer 21 is formed using thermosetting resin, such as epoxy resin to be used as interlayer insulating material when a build-up printed circuit board is manufactured. Alternatively, instead of epoxy resin, polyimide resin may be used. The resin layer 21 functions as an insulating base material for the package (wiring board) 20.

In the next step (FIG. 2F), the via holes VH reaching the pad portions 23P are formed at specific positions (positions corresponding to the portions on the conductor layer 23 in which the pad portions 23P are delimited) around the chip mount region in the resin layer 21. For example, the via holes VH having small diameters (approximately 100 μm) can be easily formed by removing the corresponding portions of the resin layer 21 using a $CO_2$ laser, an excimer laser, or the like.

In the next step (FIG. 3A), the via holes VH formed around the chip are filled with the conductors 22. For example, conductive paste containing metal, such as copper (Cu), is filled into the via holes VH, or electrolytic Cu plating is performed using the copper foil 35 as a power supplying layer, thus filling the via holes VH.

In the next step (FIG. 3B), the conductor layer 24 having a required pattern shape is formed on the resin layer 21 to be connected to the conductors 22 which is filled in the via holes VH around the chip. At this time, the portions of the conductor layer 24 which correspond to the conductors 22 are delimited as the pad portions 24P (having a diameter of approximately 150 μm). In the example, only the pad portions 24P are shown. Specifically, a thin metal film is formed on the entire surface of the resin layer 21 by sputtering, electroless plating, or the like, and a pattern (pad portions 24P) is formed by a subtractive method, a semi-additive method, or the like, using the thin metal film as a seed. For example, the entire surface of the resin layer 21 is made into a catalyst, electroless Cu plating is performed to have a thickness of approximately 3 μm (formation of the thin metal film), then a plating pattern is formed of plating resist, then, the surface of the thin metal film is electrolytically plated with Cu by pattern plating using the thin metal film as a power supplying layer, then the plating resist is removed, and thereafter unnecessary Cu is etched using the pattern made by electrolytic Cu plating as a mask, thus a Cu pattern (pad portions 24P) is formed.

Furthermore, the pad portions 24P are plated with Ni/Au as needed (formation of the Ni/Au layer 25). This is intended to improve the adhesiveness to the conductor layer (pad portions) when solder bonding is performed in a later step.

In the next step (FIG. 3C), the copper foil 35 used as a conductive base material is removed by wet etching. In this case, in order to prevent the pad portions 24P (Cu) and the Ni/Au layer 25 formed on the resin layer 21 from being subjected to a chemical solution for wet etching, first, a protective film of etching resist or the like is formed on the surface on which the pad portions 24P are formed, and then the protective film is removed after the copper foil 35 has been removed. Further, for the chemical solution for wet etching, a chemical solution which dissolves only the copper foil 35 but does not dissolve the conductor layer 23 (Ni/Pd/Au) is appropriately selected and used.

In the next step (FIG. 3D), the solder resist layer 27 is formed to cover the resin layer 21 in such a manner that the pad portions 24P formed on the upper surface are exposed, and a solder resist layer 26 (the rest of the portion of the protective film 26) is formed to cover the conductor layer 23 and the solder resist layer 26 (part of the protective film 26 shown in FIG.1) in such a manner that the pad portions 23P formed on the lower surface are exposed. For example photosensitive solder resist is applied to the entire surface of the resin layer 21, the conductor layers 23 and 24, and the solder resist layer 26 (part of the protective film 26 shown in FIG. 1), and exposure and development are performed in accordance with the shapes of the pad portions 23P and 24P (patterning of the solder resist), whereby openings in the portions of the solder resist layer which correspond to the regions of the pad portions are formed. Thus, the pad portions 23P and 24P are exposed, and the other portions are covered with the solder resist layers 26 and 27. With the forming of the solder resist layer 26 (the rest of the portion of the protective film 26), the conductor layer 23 is sandwiched between an inner-side portion of the protective film 26 (formed in the step shown in FIG. 2B) and the outer-side portion of the protective film 26 (formed in the step shown FIG. 3D).

In the final step (FIG. 3E), the solder bumps 28 as external connection terminals are formed on the pad portions 24P (Cu) exposed from the upper solder resist layer 27. These solder bumps 28 can be formed, for example, by plating. Alternatively, the following method may be adopted: after flux is applied to the pad portions 24P, solder balls are placed thereon, or solder paste is supplied thereto by printing, followed by the solder balls or the solder paste being made into bumps by reflow at a temperature of approximately 240° C. to 260° C. In this case, for after treatment, the surface is cleaned to remove the flux. In this way, the semiconductor device 10 (FIG. 1) according to the first embodiment is manufactured.

As described above, according to the first embodiment (FIGS. 1 to 3E), the semiconductor chip 40 is buried in the wiring board 20 used as a package, and the via holes VH are formed at specific positions around the chip by laser processing. Accordingly, the diameter of the individual via hole VH can be made small compared with the through hole formed by drilling as heretofore. Incidentally, in the state of the art, the diameter of the through hole is approximately 250 to 300 μm, while, in this embodiment, the diameter of the via hole VH can be made as small as approximately 100 μm. Thus, an area required around the semiconductor chip 40 becomes relatively small. Accordingly, the package 20 (semiconductor device 10) can be miniaturized.

Also, since the via hole VH is filled with the conductor 22, the pad portions 23P and 24P (top-and-bottom connecting pads) can be placed on the conductor 22. In other words, the degree of freedom of wiring can be increased compared with the following case: plated through holes are formed as heretofore, and therefore top-and-bottom connecting pads cannot be placed thereon and must be formed at other positions. In addition, since the relevant pads do not need to be formed at other positions, an area required around the semiconductor chip 40 can be accordingly reduced. This contributes to a further miniaturization of the package 20 (semiconductor device 10).

Moreover, the semiconductor chip 40 is connected to the conductors 42 which are filled in specific positions in the solder resist layer 26 by flip-chip bonding, and the conductors 42 are connected to the top-and-bottom connecting conductors 22 via the conductor layer 23 (pad portions 23P). Accordingly, the necessity to form via holes for ensuring electrical connection to the relevant chip (i.e., to form openings at predetermined positions in the resin layer 21 on the chip 40) is eliminated. Namely, the hole-making process for the resin layer 21 by laser processing is carried out only for the formation of the top-and-bottom connecting via holes VH in the region around the chip. Since the diameters of such via holes are sufficiently large compared with those of the pads on the chip, thee accuracy of laser processing in positioning can be relatively low when the relevant via holes are formed.

Moreover, packages according to this embodiment can be stacked in a multilayered manner as needed, as described later, by using the pad portions 23P and 24P exposed from the package 20 (semiconductor device 10) as top-and-bottom connecting pads or by interposing the external connection terminals (solder bumps 28) bonded to the tops of the pad portions 24P. Accordingly, a three-dimensional arrangement configuration of semiconductor chips 40 and connections therebetween can be easily realized. This contributes to an enhancement of functionality of the semiconductor device.

Furthermore, although the external connection terminals (solder bumps 28) do not necessarily need to be provided as described above, the provision of the external connection terminals has the following advantage. Specifically, since the formation of the external connection terminals (solder bumps 28) in the step of FIG. 3E makes it possible to conduct tests of functions, operations, and the like, of the package 20 (semiconductor device 10) in which the semiconductor chip 40 is buried, the relevant package can be rejected as a defective package at this stage if the relevant package does not pass the tests. Namely, only non-defective packages (semiconductor devices) can be picked up. This makes it possible to increase a yield on a product (semiconductor device) basis when non-defective packages are stacked in a multilayer structure to be modularized as described later.

Figure 4:
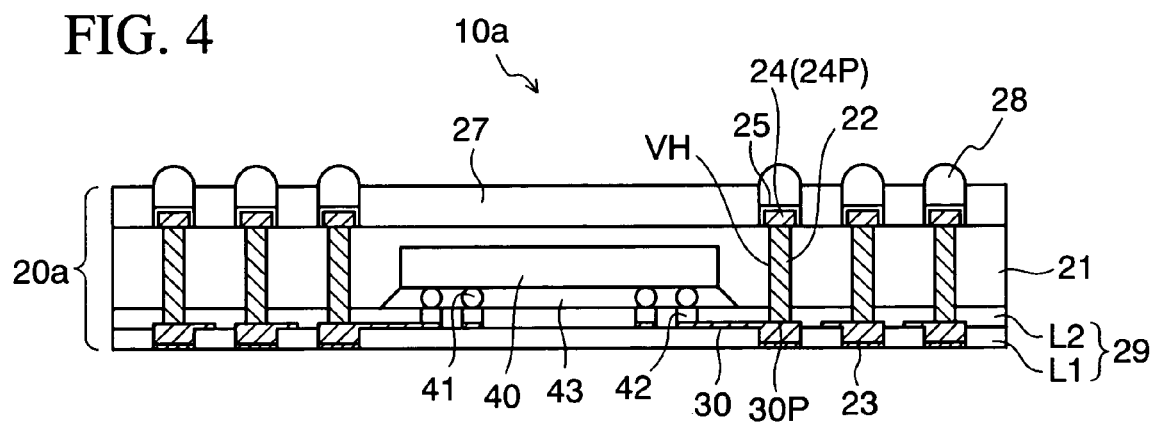
FIG. 4 is a cross-sectional view showing the structure of a semiconductor device according to a second embodiment of the present invention.
Figure 14:
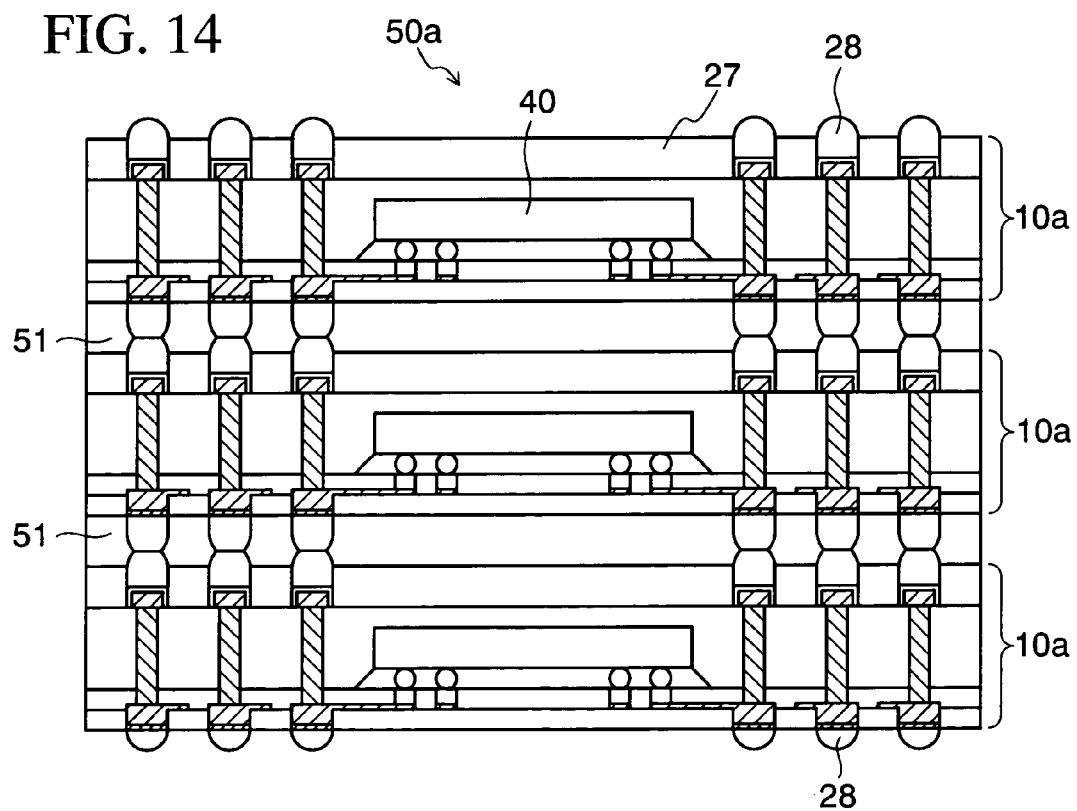
FIG. 14 is a cross-sectional view showing the structure of a semiconductor device according to a sixth embodiment of the present invention.

FIG. 4 schematically shows a cross-sectional structure of a semiconductor device according to a second embodiment of the present invention.

In this embodiment, similar to the first embodiment (FIG. 1), the semiconductor device 10a includes a wiring board 20a used as a package, and the semiconductor chip 40 buried in this package (wiring board) 20a. The package (wiring board) 20a in this embodiment differs from the package (wiring board) 20 in the first embodiment in the following points: a lower protective film 29 has a two-layer structure including an insulating layer Li on an exposed side and a solder resist layer L2 on an internal layer side; and the portions (pad portions 30P) of the conductor layer 30 which correspond to the conductors 22 are exposed, while the conductor layer 30 is electrically connected to the electrode terminals 41 of the chip 40, to one surface (lower surface) of the wiring board 20a via the conductor layer 23. Other components and functions thereof are the same as those of the first embodiment, and thus the explanation thereof is omitted.

Further, in a method of manufacturing the semiconductor device 10a of this embodiment, some of manufacturing steps thereof are also different because of the features of the above-described constitution. Namely, the manufacturing method (FIGS. 5A to 6E) according to this embodiment differs from the manufacturing method (FIGS. 2A to 3E) according to the first embodiment in the following points: instead of the step of FIG. 2A, the insulating layer Li (first protective film) is formed on one surface of the copper foil 35 in such a manner that portions corresponding to specific positions around the chip mount region MR are exposed (step of FIG. 5A); and furthermore, after the conductor layer 23 is formed in portions corresponding to the above-described specific positions, the conductor layer 30 having a required pattern shape is formed on the conductor layer 23 and the insulating layer L1 so as to extend within the chip mount region MR and to have the pad portions 30P on the conductor layer 23 (step of FIG. 5B). Where the conductor layer 30 is formed, various passive elements (resistance element, inductance element, capacitance element) may be formed by a thin film process similarly to the case of the first embodiment (step of FIG. 2A). Other steps are basically the same as in the case of the first embodiment, and thus the explanation thereof is omitted.

Figure 6A:
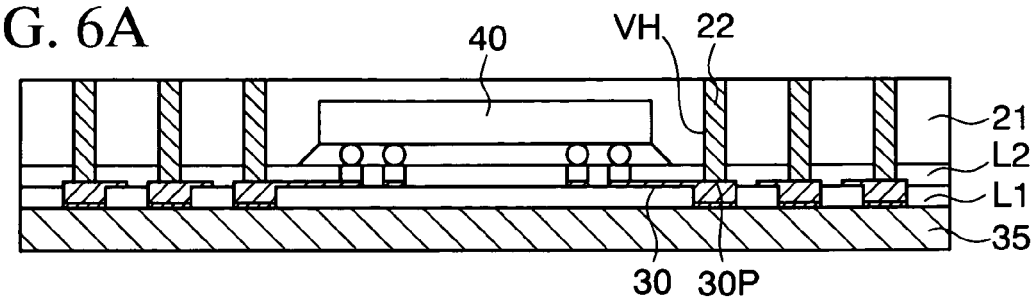
FIGS. 6A to 6E are cross-sectional views showing manufacturing steps subsequent to the manufacturing steps of FIGS. 5A to 5F.
Figure 6B:
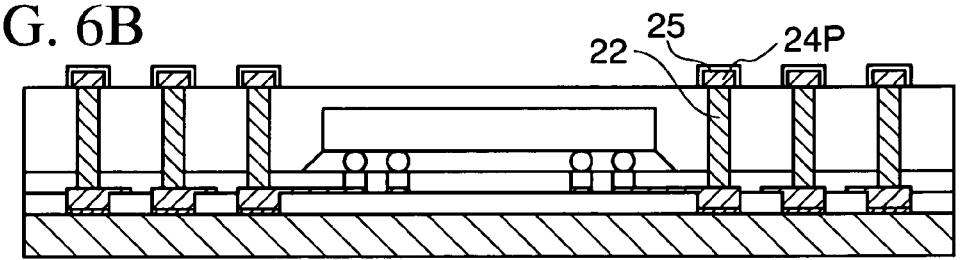
Figure 6C:
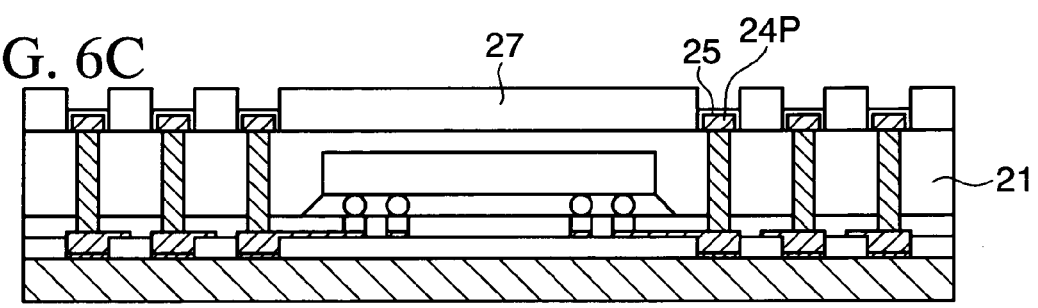
Figure 6D:
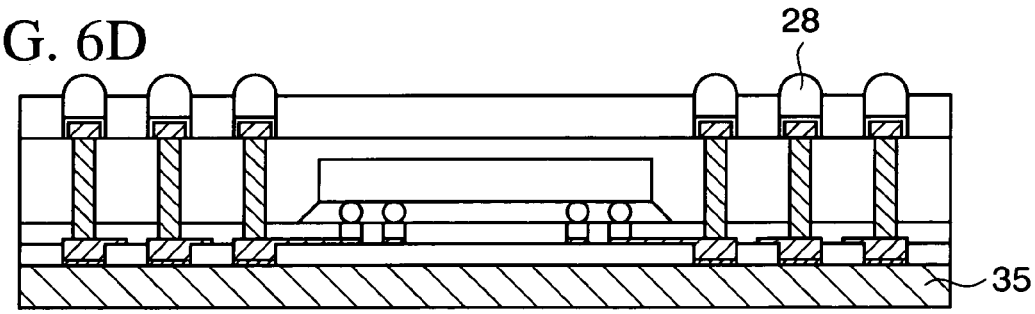
Figure 6E:
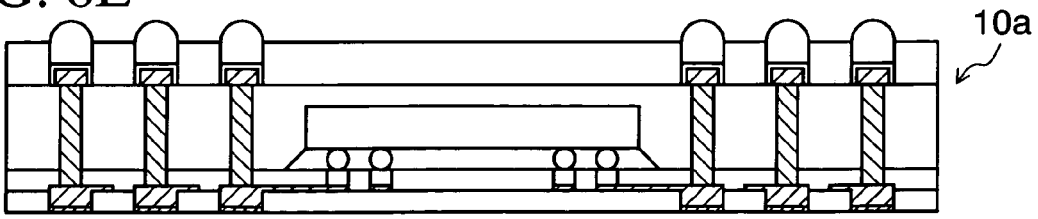

Note, in the manufacturing method (refer to FIGS. 5A to 6E) according to this second embodiment, unlike the case of the first embodiment, after the solder resist layer 27 has been formed in such a manner that the pad portions 24P (Ni/Au layer 25) are exposed, and the solder bumps 28 have been formed on the pad portions 24P (steps of FIGS. 6C and 6D), then the copper foil 35 is removed (step of FIG. 6E). In this case, if the order in which the formation of the solder resist layer 27, the formation of the solder bumps 28, and the removal of the copper foil 35 are performed is reversed similarly to the first embodiment, the external connection terminals (solder bumps 28) can be selectively bonded to both the upper pad portions 24P (Ni/Au layer 25) and the lower pad portions 30P (conductor layer 23).

This second embodiment (FIGS. 4 to 6E) has effects similar to those of the first embodiment because the second embodiment has substantially the same constitution as the first embodiment.

Figure 7:
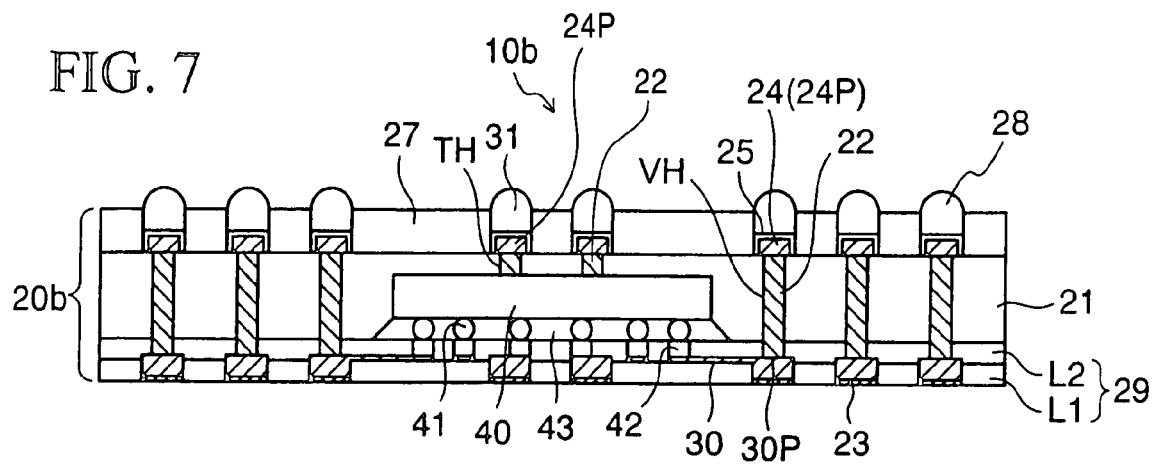
FIG. 7 is a cross-sectional view showing the structure of a semiconductor device according to a third embodiment of the present invention.
Figure 15:
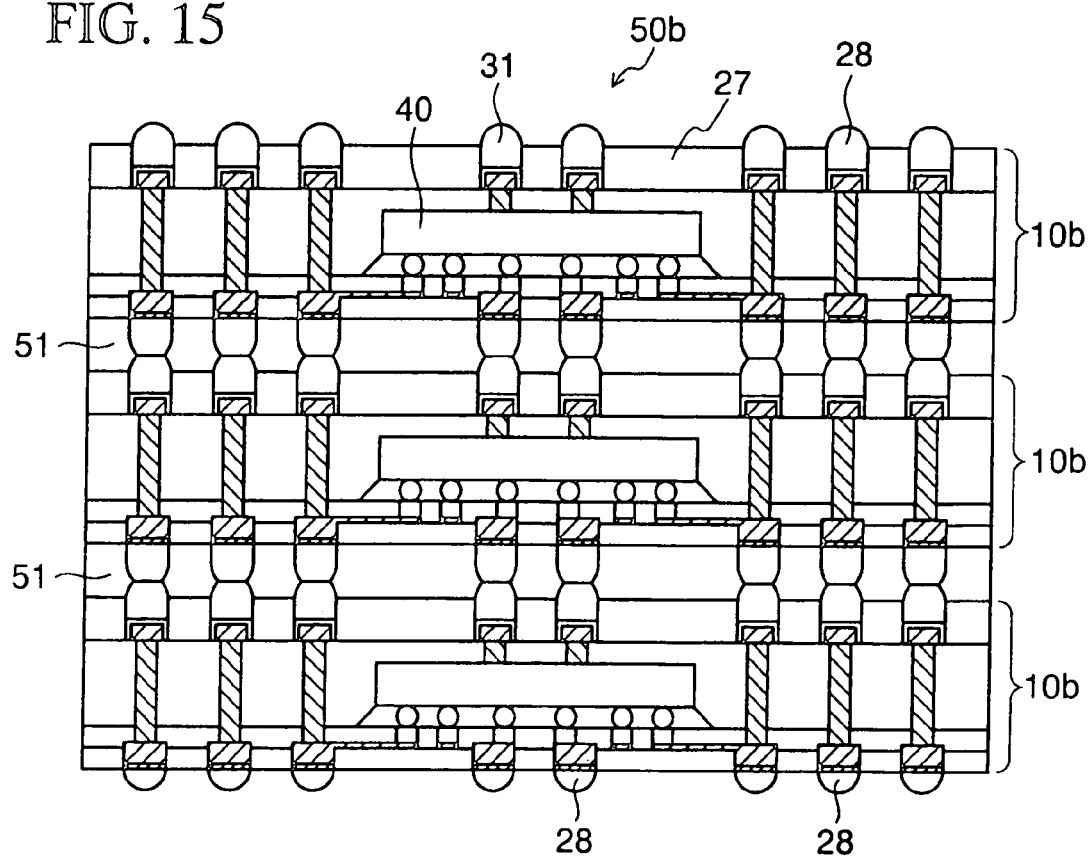
FIG. 15 is a cross-sectional view showing the structure of a semiconductor device according to a seventh embodiment of the present invention.

FIG. 7 schematically shows a cross-sectional structure of a semiconductor device according to a third embodiment of the present invention.

In this embodiment, similar to the second embodiment (FIG. 4), the semiconductor device 10b includes a wiring board 20b used as a package, and the semiconductor chip 40 buried in this package (wiring board) 20b. The package (wiring board) 20b in this embodiment differs from the package (wiring board) 20a in the second embodiment in the following points: heat spreading via holes (thermal vias) TH are formed in the resin layer 21 to communicate with the surface of the semiconductor chip 40 which is opposite to the surface having the electrode terminals 41 formed thereon; and the thermal vias TH are filled with the conductors 22 as thermally conductive bodies, and furthermore, the pad portions 24P (Ni/Au layer 25) on the conductors 22 are exposed from the solder resist layer 27 or covered with the exposed solder bumps 31 as thermally conductive bodies. Other components and functions thereof are basically the same as in the case of the second embodiment, and thus the explanation thereof is omitted.

Figure 8A:
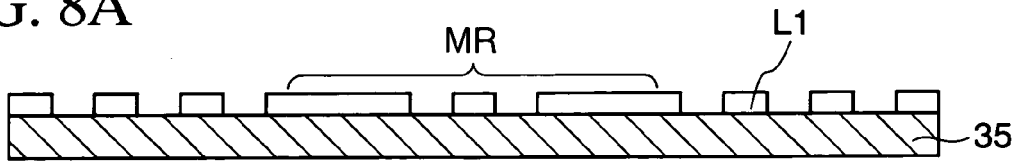
FIGS. 8A to 8F are cross-sectional views showing manufacturing steps for the semiconductor device of FIG. 7.
Figure 8B:
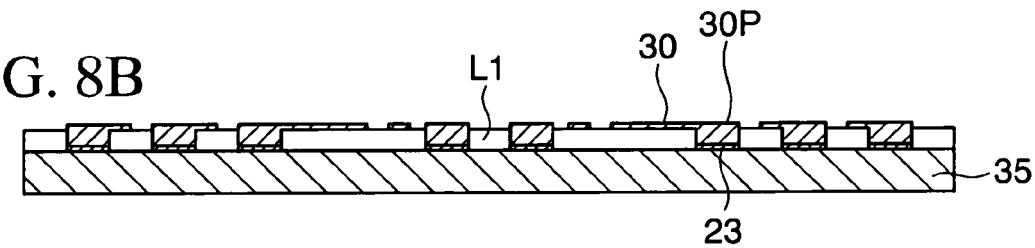
Figure 8C:
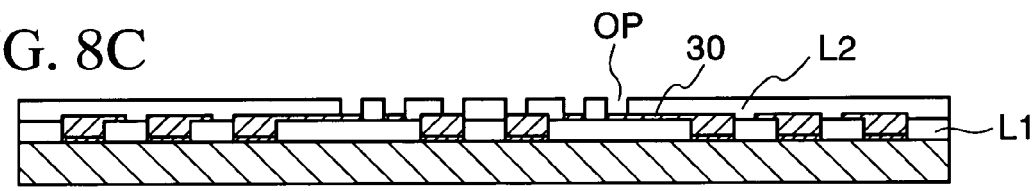
Figure 8D:
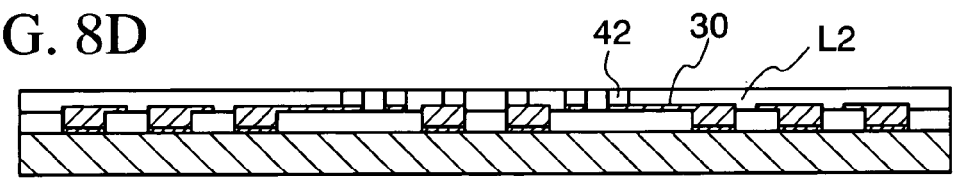
Figure 8E:
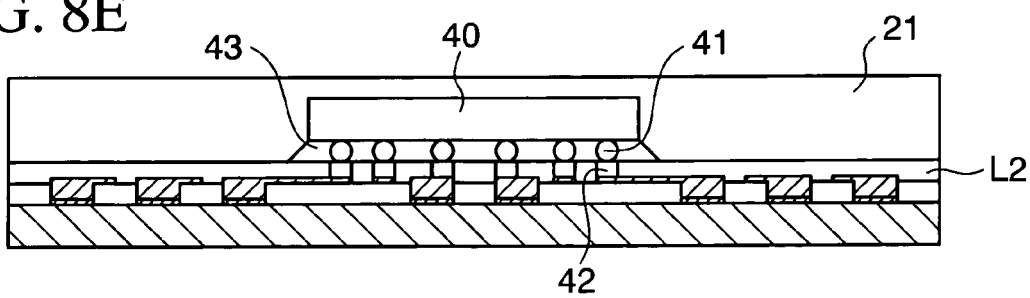
Figure 8F:
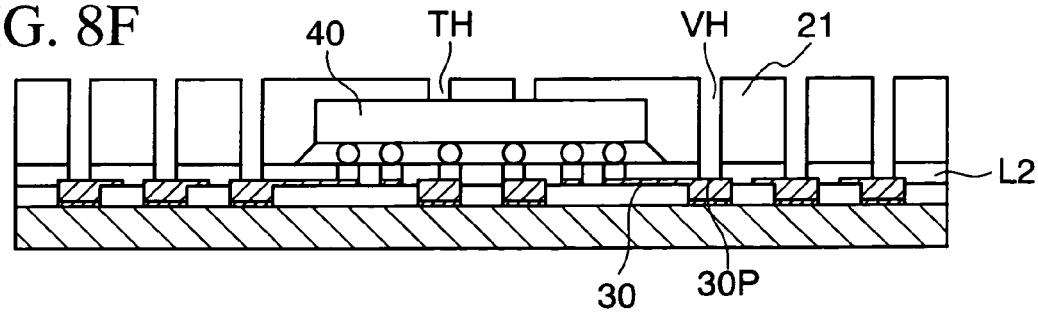
Figure 9A:
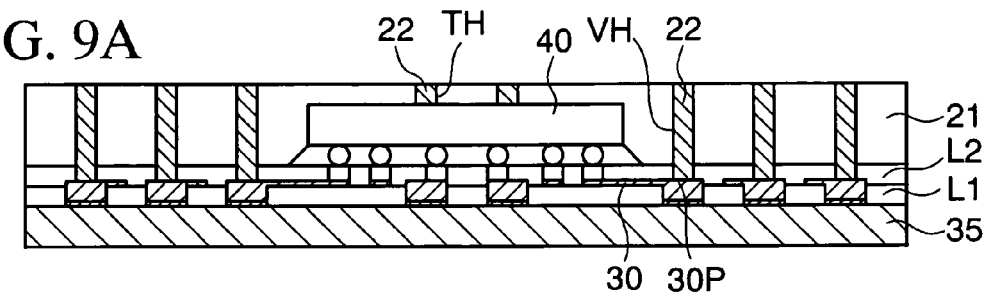
FIGS. 9A to 9E are cross-sectional views showing manufacturing steps subsequent to the manufacturing steps of FIGS. 8A to 8F.
Figure 9B:
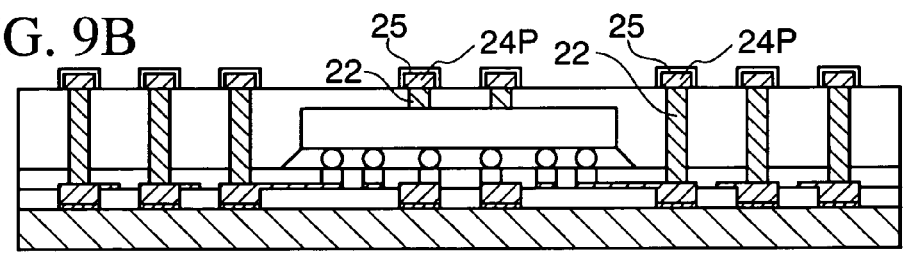
Figure 9C:
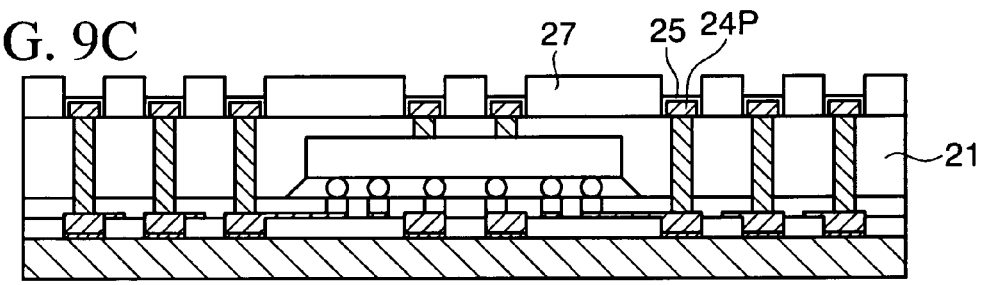
Figure 9D:
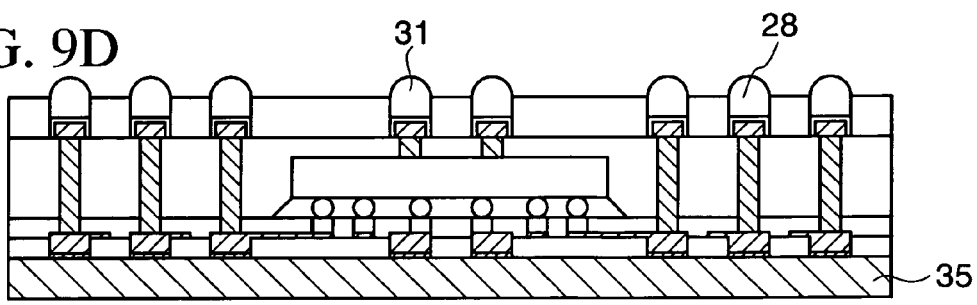
Figure 9E:
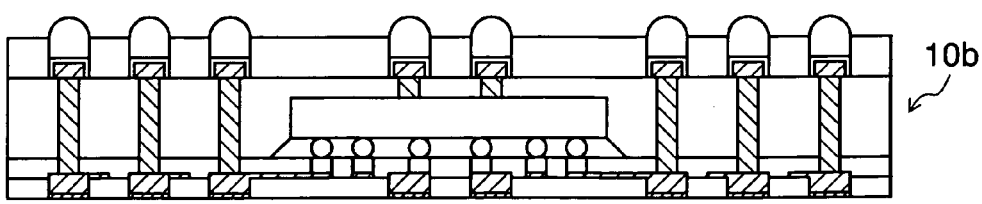

Further, in a method of manufacturing the semiconductor device 10b of this embodiment, some of manufacturing steps thereof are also different because of the features of the above-described constitution. Namely, the manufacturing method (FIGS. 8A to 9E) according to this embodiment differs from the manufacturing method (refer to FIGS. 5A to 6E) according to the second embodiment in the following points: when the via holes VH which pierce the resin layer 21 to reach the pad portions 30P are formed in the step of FIG. 8F, the thermal vias TH are formed to reach the surface of the semiconductor chip 40 which is opposite to the surface having the electrode terminals 41 formed thereon; when the via holes VH are filled with the conductors 22 in the step of FIG. 9A, the thermal vias TH are filled with the conductors 22 as thermally conductive bodies; and when the solder resist layer 27 is formed in the step of FIG. 9C, the pad portions 24P (Ni/Au layer 25) on the thermal vias TH, together with the pad portions 24P (Ni/Au layer 25) on the via holes VH, are exposed. Incidentally, where the conductor layer 30 is formed in the step of FIG. 8B, various passive elements (resistance element, inductance element, capacitance element) may be formed by a thin film process similarly to the case of the second embodiment (step of FIG. 5B). Other steps are basically the same as in the case of the second embodiment, and thus the explanation thereof is omitted.

According to this third embodiment (FIGS. 7 to 9E), in addition to various advantages obtained in the second embodiment, when packages 20b (semiconductor devices 10b) according to this embodiment are stacked in a multilayer structure to be modularized, heat generated in each chip 40 in the device can be spread to the outside via the solder bumps 31 (thermally conductive bodies), based on the features of the above-described constitution.

Incidentally, in this third embodiment, a process (formation of the thermal vias TH) of forming openings at predetermined positions in the resin layer 21 on the chip 40 is performed. These thermal vias TH are via holes for heat spreading, not via holes for ensuring electrical connection to the relevant chip. Accordingly, the accuracy of laser processing in positioning may be relatively low when the thermal vias TH are formed.

Figure 10:
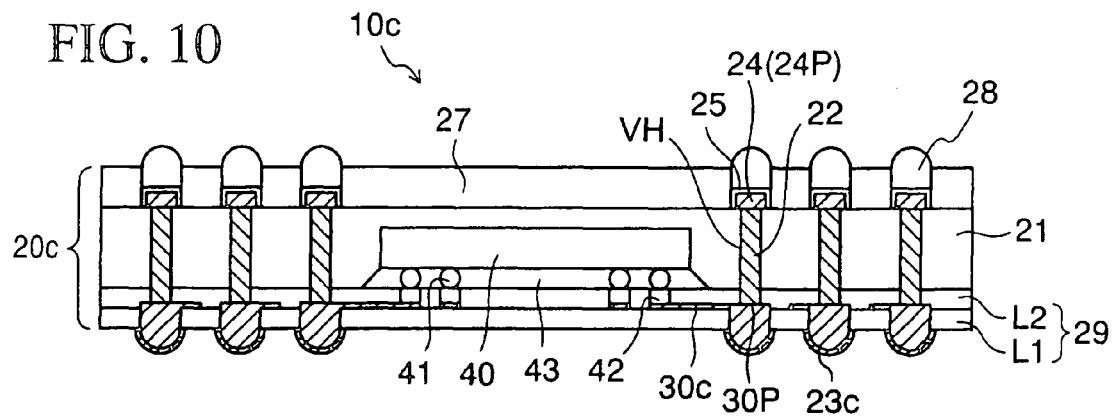
FIG. 10 is a cross-sectional view showing the structure of a semiconductor device according to a fourth embodiment of the present invention.
Figure 16:
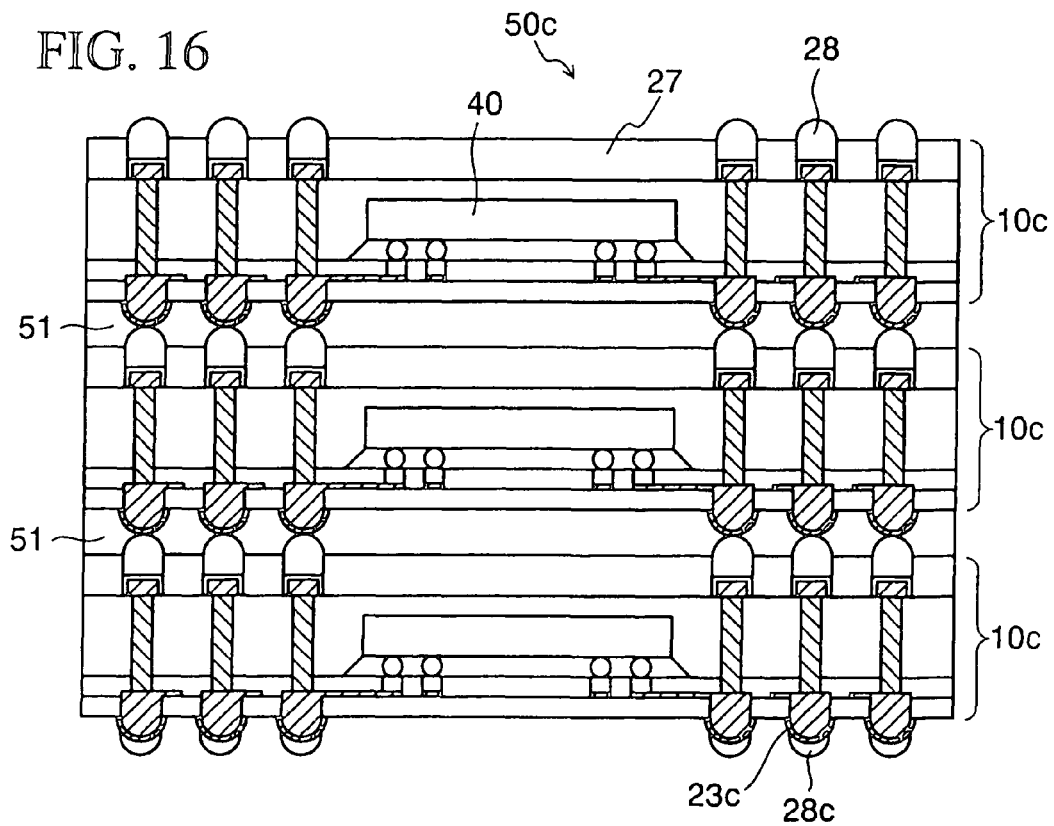
FIG. 16 is a cross-sectional view showing the structure of a semiconductor device according to an eighth embodiment of the present invention.

FIG. 10 schematically shows a cross-sectional structure of a semiconductor device according to a fourth embodiment of the present invention.

In this embodiment, similar to the second embodiment (FIG. 4), the semiconductor device 10c includes a wiring board 20c used as a package, and the semiconductor chip 40 buried in this package (wiring board) 20c. The package (wiring board) 20c in this embodiment differs from the package (wiring board) 20a in the second embodiment in the following points: the portions (pad portions 30P) of a conductor layer 30c which correspond to the conductors 22 are exposed, while the conductor layer 30c is electrically connected to the electrode terminals 41 of the chip 40, to one surface (lower surface) of the wiring board 20c via a conductor layer 23; and the pad portions 30P (conductor layer 23c) protrude from the exposed surface of the protective film 29. Other components and functions thereof are the same as in the case of the second embodiment, and-thus the explanation thereof is omitted.

Further, in a method of manufacturing the semiconductor device 10c of this embodiment, some of manufacturing steps thereof are also different because of the features of the above-described constitution. Namely, the manufacturing method (FIGS. 11A to 12E) according to this embodiment differs from the manufacturing method (FIGS. 5A to 6E) according to the second embodiment in the following point: in the step of FIG. 11B, recessed portions RP are formed in portions (portions in which the pad portions 30P are to be formed) corresponding to specific positions around the chip mount region MR by etching the copper foil 35, and furthermore, the conductor layer 23c is formed on the surfaces of the recessed portions RP. Since the recessed portions RP are thus formed in the portions in which the pad portions 30P are to be formed, the pad portions 30P (conductor layer 23c) protrude from the exposed surface of the protective film 29 (L1 and L2) when the copper foil 35 is removed in a later step (FIG. 12E). Incidentally, where the conductor layer 30c is formed in the step of FIG. 11C, various passive elements (resistance element, inductance element, capacitance element) may be formed by a thin film process similarly to the case of the second embodiment (step of FIG. 5B). Other steps are basically the same as in the case of the second embodiment, and thus the explanation thereof is omitted.

According to this fourth embodiment (refer to FIGS. 10 to 12E), in addition to various advantages obtained in the second embodiment, when packages 20c (semiconductor devices 10c) according to this embodiment are stacked in a multilayer structure to be modularized, the amount of solder used for connections between the packages can be decreased because the pad portions 30P (conductor layer 23c) protrude, based on the features of the above-described constitution.

Figure 11A:
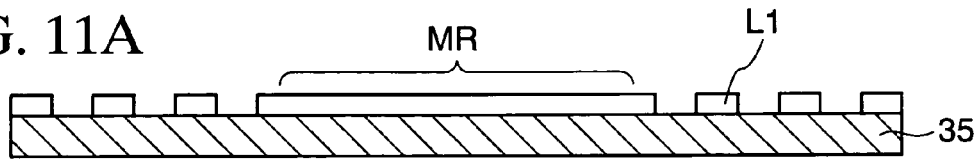
FIGS. 11A to 11F are cross-sectional views showing manufacturing steps for the semiconductor device of FIG. 10.
Figure 11B:
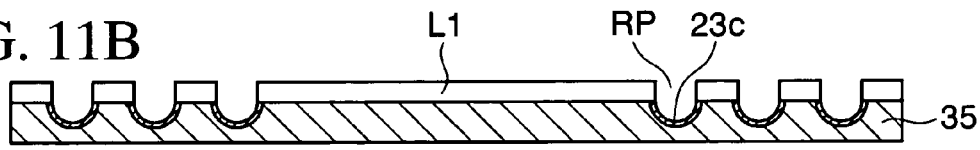
Figure 11C:
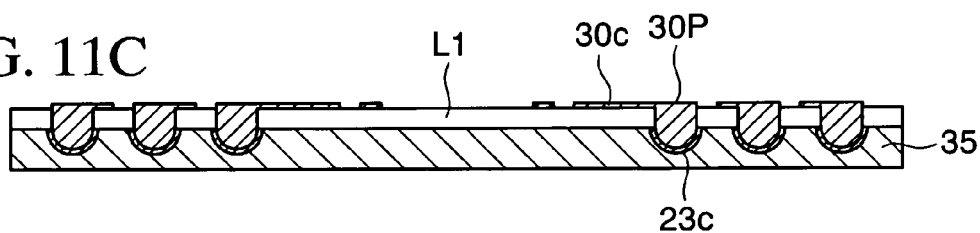
Figure 11D:
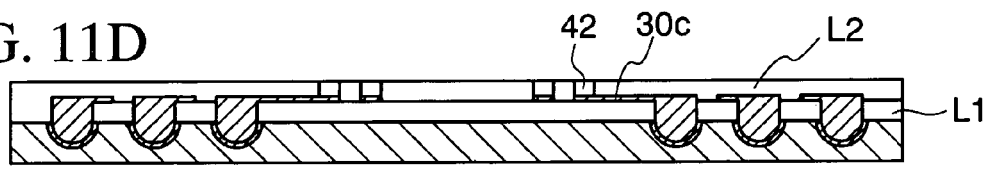
Figure 11E:
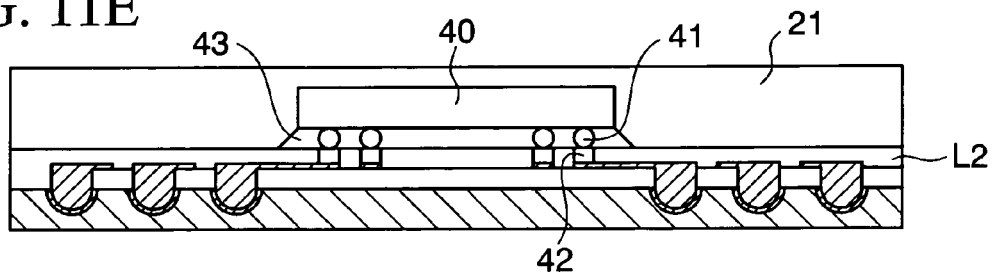
Figure 11F:
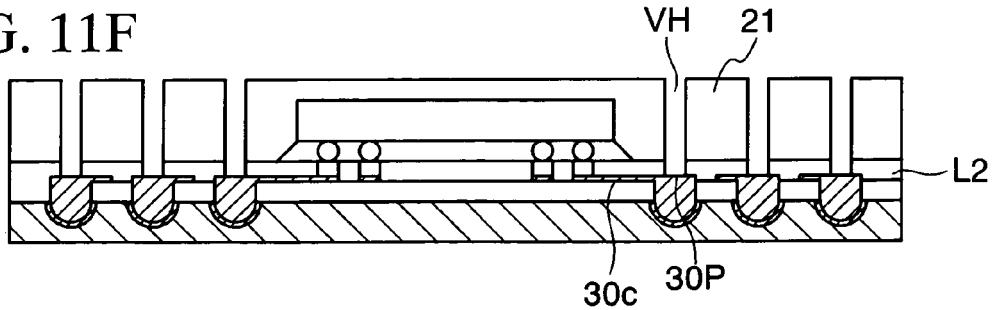
Figure 12A:
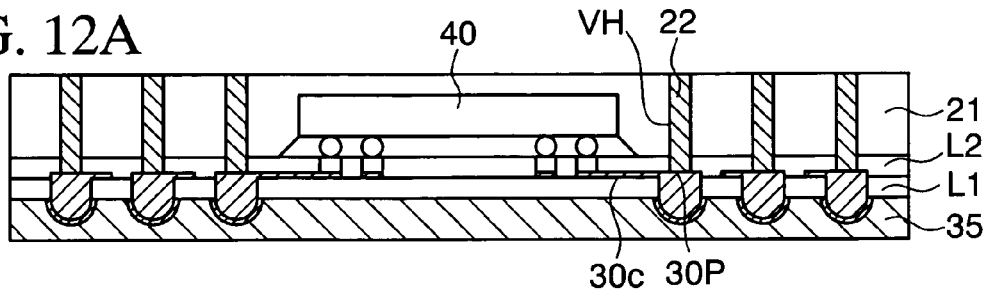
FIGS. 12A to 12E are cross-sectional views showing manufacturing steps subsequent to the manufacturing steps of FIGS. 11A to 11F.
Figure 12B:
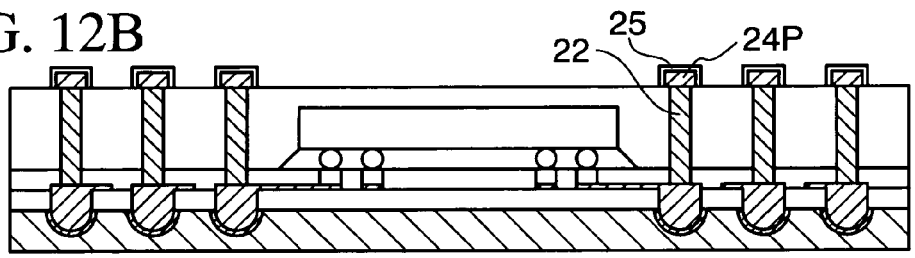
Figure 12C:
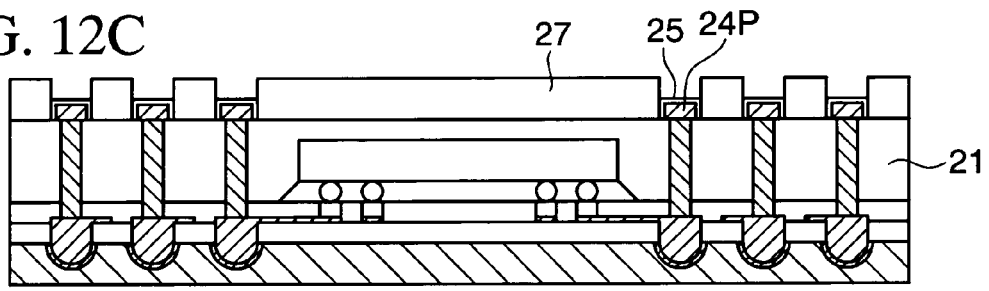
Figure 12D:
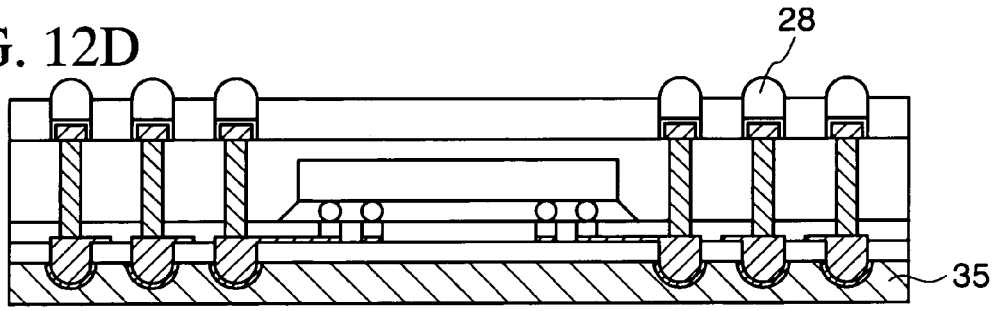
Figure 12E:
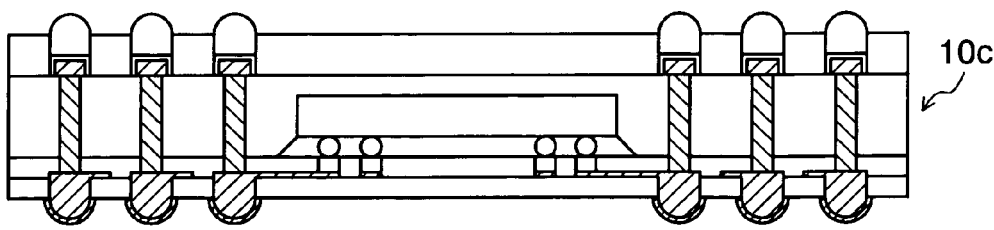

Further, in the steps of Figs. 11B and 1C, where the insides of the recessed portions RP are filled with solder by electrolytic solder plating, instead of forming the conductor layer 23c in the recessed portions RP and further forming the pad portions 30P on the conductor layer 23c, solder bumps as external connection terminals of the semiconductor device 10c can be finally constituted.

FIGS. 13 to 16 schematically show cross-sectional structures of semiconductor devices according to fifth to eighth embodiments of the present invention, respectively.

The semiconductor devices 50, 50a, 50b, and 50c (FIGS. 13, 14, 15, and 16) according to the fifth, sixth, seventh, and eighth embodiments each have a stacked structure in which semiconductor devices 10, 10a, 10b, or 10c (FIGS. 1, 4, 7, or 10) according to the first, second, third, or fourth embodiment are stacked in three layers to be modularized, respectively. In each of the semiconductor devices 50, 50a, 50b, and 50c, two vertically adjacent semiconductor devices 10, 10a, 10b, or 10c are electrically connected to each other via the top-and-bottom connecting pads (pad portions 23P, 30P, conductor layer 23, 23c) of one semiconductor device and the external connection terminals (solder bumps 28) of the other, and bonded together using underfill resin 51 filling the space between both devices. Furthermore, in the semiconductor device 50b (FIG. 15), two vertically adjacent semiconductor devices 10b are thermally coupled together via thermally conductive bodies (solder bumps 31).

Further, in each of the semiconductor devices 50, 50a, and 50b (FIGS. 13 to 15) according to the fifth to seventh embodiments, in order to realize a stacked structure, the semiconductor device 10, 10a, or 10b in each layer has the external connection terminals (solder bumps 28) provided on both surfaces thereof. Meanwhile, in the semiconductor device 50c (FIG. 16) according to the eighth embodiment, each of the semiconductor devices 10c in the uppermost and middle layers has the external connection terminals (solder bumps 28) provided only on one surface (upper surface) thereof, and the semiconductor device 10c in the lowest layer has the external connection terminals (solder bumps 28, 28c) provided on both surfaces thereof. In this case, the amount of solder used for the lower solder bumps 28c of the semiconductor device 10c in the lowest layer is relatively small because the conductor layer 23c protrudes in convex shapes.

Further, in the semiconductor device 50b (FIG. 15) according to the seventh embodiment, it is desirable that the semiconductor device 10b in which the chip 40 spreading the largest amount of heat is buried is provided in the uppermost layer in consideration of the direction of spread heat(direction from bottom to top) generated in the chips 40 buried in the stacked semiconductor devices 10b.

Incidentally, for each of the semiconductor devices 50, 50a, 50b, and 50c according to the fifth to eighth embodiments, the description has been made taking as an example the case where the semiconductor devices 10, 10a, 10b, or 10c according to the first to fourth embodiments are stacked in three layers to be a multilayer structure. However, it is a matter of course that the number of stacked layers is not limited to three. Namely, the number of stacked layers can be appropriately selected according to functions required for a semiconductor device having a modularized stacked structure.

Figure 17:
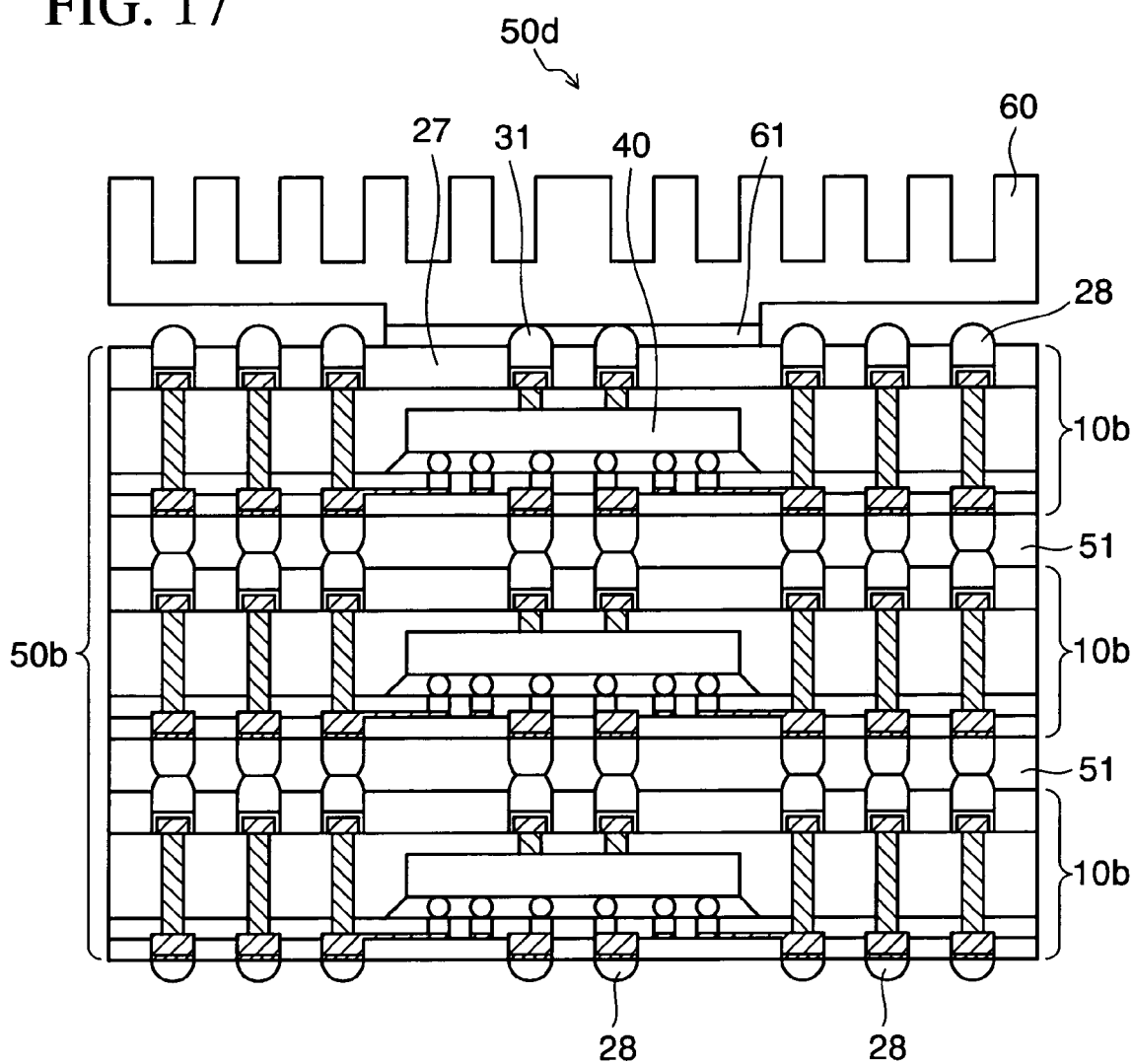
FIG. 17 is a cross-sectional view showing the structure of a semiconductor device according to a ninth embodiment of the present invention.

FIG. 17 schematically shows a cross-sectional structure of a semiconductor device according to a ninth embodiment of the present invention. In the semiconductor device 50d of this embodiment, a radiating fin (radiator) 60 for effectively spreading heat generated in the chips 40 provided inside the relevant device to the outside is attached to the semiconductor device 50b having the stacked structure shown in FIG. 15. Namely, this radiating fin 60 is brought into contact with the solder bumps 31 (thermally conductive bodies) exposed from the semiconductor device 10b in the uppermost layer to be bonded to the solder resist layer 27 of the relevant semiconductor device 10b with adhesive 61 having high thermal conductivity. As the adhesive, for example, thermosetting resin, such as epoxy resin, is used. Alternatively, instead of adhesive, adhesive sheet (prepreg) can also be used. As the adhesive sheet (prepreg), a reinforcing member, such as a glass cloth, which has been immersed in thermosetting resin, such as epoxy resin or BT resin, to be brought into B stage state, is typically used.

What is claimed is:

1. A semiconductor device comprising:

a wiring board; and at least one semiconductor element buried in the wiring board in a semiconductor element mount region, wherein the wiring board has an insulating base material having an upper and a lower surface with a direction extending from the upper surface to the lower surface being a thickness direction;

an inner-side portion of a first protective film is formed on the lower surface of the insulating base material;

a via hole is formed in a region around the semiconductor element to pierce the insulating base material and the inner-side portion of said first protective film in the thickness direction;

the via hole is filled with a conductor;

first and second conductor layers are formed on the inner-side portion of the first protective film and on the upper surface of the insulating base material, respectively, the first and second conductor layers are respectively connected to one end and another end of the conductor in the via hole, the first and second conductor layers have required pattern shapes and the first conductor layer is separated, in the thickness direction, from the lower surface of the insulating base material by the inner-side portion of the first protective film;

an outer-side portion of the first protective film is formed for covering the inner-side portion of the first protective film and for covering the first conductor layer so as to sandwich, in the thickness direction, the first conductor layer between the outer-side portion and the inner-side portion of the first protective film, the outer-side portion of the first protective film is formed with a first pad portion exposed, the first pad portion being delimited in a portion of the first conductor layer which corresponds to the conductor in the via hole;

a second protective film is formed for covering the insulating base material and the second conductor layer, the second protective film is formed with a second pad portion exposed, the second pad portion being delimited in a portion of the second conductor layer which corresponds to the conductor in the via hole; and the first conductor layer extends within the semiconductor element mount region, and the semiconductor element is placed with flip-chip technology with at least some of electrode terminals of the semiconductor element electrically connected to the first conductor layer at the portion of the first conductor layer extending within the semiconductor element mount region.

2. The semiconductor device according to claim 1, wherein an external connection terminal is bonded to at least one of the first and second pad portions.

\* \* \* \* \*